United States Patent [19]

Katou et al.

[11] Patent Number: 5,500,103

[45] Date of Patent: Mar. 19, 1996

[54] METHOD FOR PREPARING THIN FILM ELECTRO-LUMINESCENCE ELEMENT

[75] Inventors: Hisato Katou, Yokosuka; Tomoyuki Kawashima, Yokohama; Harutaka Taniguchi; Shin'ichi Nakamata, both of Yokosuka; Kazuyoshi Shibata, Yokohama, all of Japan

[73] Assignee: Fuji Electric Co., Ltd., Japan

[21] Appl. No.: 452,729

[22] Filed: May 30, 1995

Related U.S. Application Data

[63] Continuation of Ser. No. 161,490, Dec. 6, 1993, abandoned.

[30] Foreign Application Priority Data

Dec. 7, 1992 [JP] Japan .................................. 4-325864

[51] Int. Cl.$^6$ ................................................ C23C 14/34
[52] U.S. Cl. ................................ 204/192.26; 204/192.15
[58] Field of Search ........................ 204/192.15, 192.26, 204/192.27, 192.28

[56] References Cited

U.S. PATENT DOCUMENTS

| 4,279,726 | 7/1981 | Baird et al. | 204/192.26 |
| 4,389,295 | 6/1983 | Davey et al. | 204/192.26 |
| 4,675,092 | 6/1987 | Baird et al. | 204/192.26 |

FOREIGN PATENT DOCUMENTS

| 49-48835 | 12/1974 | Japan | 204/192.26 |
| 62-271396 | 11/1987 | Japan | |
| 63-6774 | 1/1988 | Japan | |

OTHER PUBLICATIONS

Lagnado et al., "Rf–Sputtered . . . Crystals", The Journal of vacuum science and technology, vol. 7, No. 2, 1970, pp. 318–321.

Primary Examiner—Nam Nguyen
Attorney, Agent, or Firm—Parkhurst, Wendel & Rossi

[57] ABSTRACT

A light-emitting layer is prepared by using sputtering gas containing $H_2S$ gas at a concentration greater than 20% by volume, and by sputtering a target under the optimal electric discharge power corresponding to the concentration of $H_2S$ gas. A light-emitting layer having good light-emitting characteristics is obtained under a high film-forming rate.

10 Claims, 3 Drawing Sheets

5,500,103

METHOD FOR PREPARING THIN FILM ELECTRO-LUMINESCENCE ELEMENT

This is a Continuation of application Ser. No. 08/161,490 filed Dec. 6, 1993, now abandoned.

FIELD OF THE INVENTION

The present invention relates to a method for preparing a thin-film EL (Electro-luminescence) element, a light emitting layer of which is formed by sputtering.

BACKGROUND OF THE INVENTION

FIG. 2 is a cross-sectional drawing of a conventional thin-film EL element. The thin film EL element has a double insulating structure, wherein a transparent electrode 12, first insulating layer 13, EL light-emitting layer 14, second insulating layer 15, and back electrode 16 are all prepared on a glass substrate 11. The light-emitting layer 14 is made of II–VI group element sulfide, to which doping material yielding luminescent centers such as a small quantity of Mn, Tb, Sm, Tm, Pr, etc. are added thereto. The II–VI group element sulfide utilized may include zinc sulfide (ZnS), calcium sulfide (CaS), strontium sulfide (SrS), and others.

Several different methods have been examined for preparing the light-emitting layer, including the vacuum evaporation method, the atomic layer crystal growth evaporation (ALE) method, which is one of the CVD methods, and the sputtering method. Since the sputtering method can prepare a uniform film having a large area, it is most suitable for mass production.

Light-emitting layers prepared by the sputtering method, however, are inferior in light-emitting luminance (See ACTA POLYTECNICA SCANDINAVICA, Applied Physics Series, No.170 "5th International Work Shop on Electrochemistry" pp. 41–48). Further examination of the sputtering method by applicants has shown that zinc, manganese, and sulfur are different from one another in physical properties such as sputter rate and vapor pressure: that actual film composition is considerably different from target composition; and that the crystalline nature of the light-emitting layer is degraded as a result.

Reactive sputtering is expected to be a method for obtaining a uniform and high quality light-emitting layer. Japanese laid-open application No. 62-271396 discloses a reactive sputtering method using a zinc target and hydrogen sulfide gas. A uniform and high quality light-emitting layer is prepared by using an inactive gas containing 5–20% hydrogen sulfide ($H_2S$) by volume and by setting substrate temperature to 100°–350° C. A particularly good result is obtained when the substrate temperature is set to a range of 200°–250° C., the hydrogen sulfide concentration is set to 10%, the electric discharge pressure is set to 10 mTorr, and the electric discharge power is set to 8 W/in² (1.2 W/cm²).

A light-emitting layer produced under the above conditions, however, has a film-forming rate of about 13 nm/min, which is too slow for practical use. While a high film-forming rate can be achieved by using a high electric discharge power, a light-emitting layer having good characteristics cannot be obtained simply by increasing electric discharge power. Increasing electric discharge alone increases only the quantity of zinc and manganese supplied; the supply of sulfur does not keep balance with the supply of zinc or manganese. As a consequence, the composite ratio of zinc to sulfur in the film is no longer 1 to 1, and a light-emitting layer having good characteristics cannot be obtained.

SUMMARY OF THE INVENTION

The present invention is designed to optimize the reactive sputtering method and to provide a method for preparing a light-emitting layer superior in film formation rate and film quality for which the film is kept to have a stoichiometric composition giving good light-emitting characteristics.

The present invention uses the following method to surmount the limitations of the prior art for preparing a thin-film EL element. Specifically, the present invention is a method for preparing a thin-film EL element that includes a light-emitting layer consisting of zinc sulfide to which a doping material yielding a luminescent center is added. In this method, a sputtering gas containing hydrogen sulfide gas at greater than 20% in volume in inactive gas is used; based on the hydrogen sulfide concentration, an optimal electric discharge is applied to sputter a target.

Further, in the present invention, targets made of an alloy of zinc and a doping material yielding luminescent centers are used. More specifically, either of the following is used: a zinc target to which a doping material yielding a luminescent center plate with area in a prescribed ratio to the exposed area of zinc is made to adhere, or both of target consisting of a zinc and consisting of doping material yielding luminescent centers are used. Manganese is used as a luminescent center material. Then, sputtering gas containing hydrogen sulfide at a concentration of 25% to 50% in volume is applied, and supplying the target with electric discharge power at a density of 2 to 5 W/cm².

FIG. 3 is a block diagram showing the relationship between electric discharge power and light-emitting luminance, using $H_2S$ concentration as parameter. A target with a diameter of 100 mm was used. When the concentration of $H_2S$ gas contained in the sputtering gas is constant, an optimal value of electric discharge power can be determined. The optimal electric discharge power for the given concentration of $H_2S$ generates a high quality light-emitting layer.

DETAILED DESCRIPTION OF THE PREFERRED EMBODIMENTS

Figure 2:
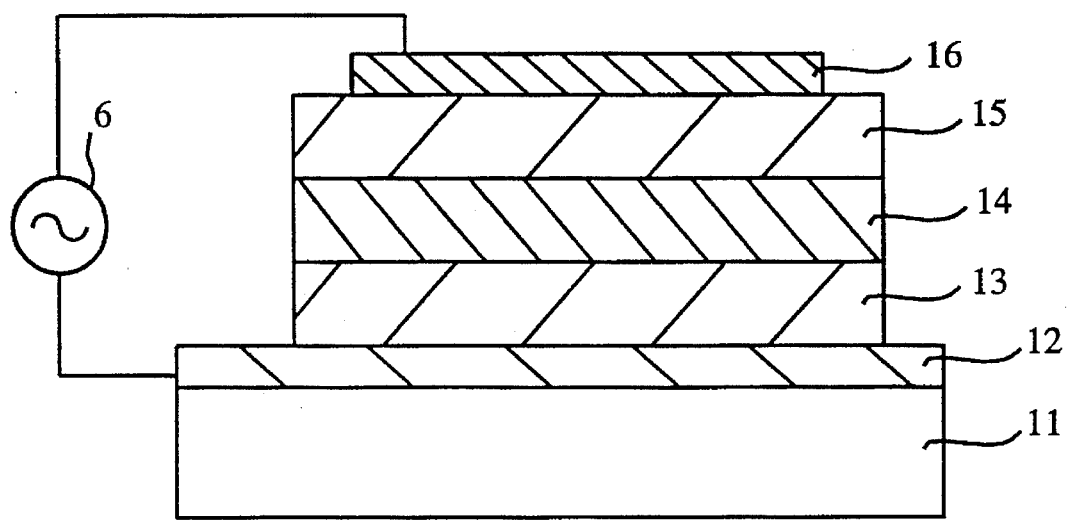
FIG. 2 is a cross-sectional drawing showing a thin-film EL element that is prepared in accordance with the embodiment of the present invention.

FIG. 2 is a cross-sectional view showing a thin-film EL element relating to an embodiment of the present invention. A transparent electrode 12 with a thickness of 1700 Å is prepared on glass substrate 11 by sputtering an ITO target. The first insulating layer 13 consists of a tantalum pentoxide ($Ta_2O_5$) layer and a silicon dioxide ($SiO_2$) layer, wherein the tantalum pentoxide ($Ta_2O_5$) layer is prepared on the silicon dioxide ($SiO_2$) at a thickness ratio of 1:9. Since $Ta_2O_5$ has a large dielectric constant, the voltage applied to the insulating layer when the thin-film EL element is driven is reduced, thereby lowering the applied driving voltage. The tantalum pentoxide $Ta_2O_5$ that is made to adhere directly on to the ITO film loses the characteristics of the ITO film. Accordingly, the $SiO_2$ film is provided between the ($Ta_2O_5$) layer and the ITO film.

Figure 1:
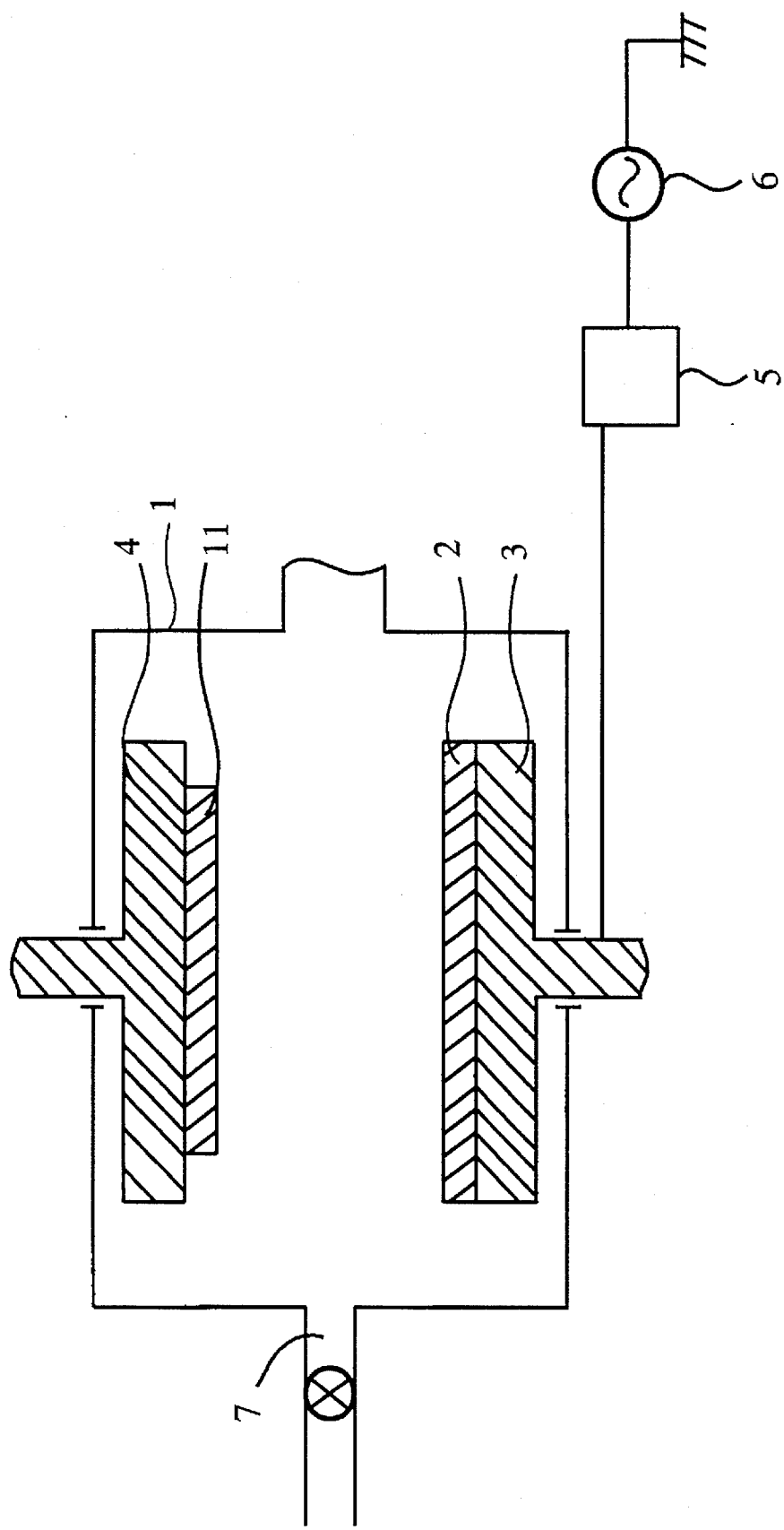
FIG. 1 is a cross-sectional drawing showing a sputtering apparatus relating to an embodiment of the present invention.
Figure 3:
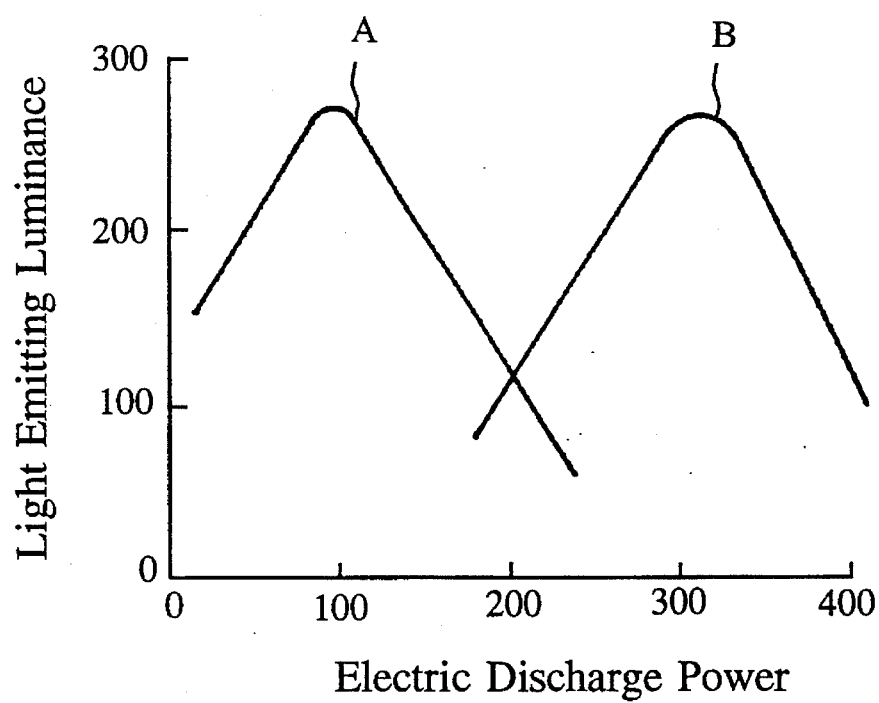
FIG. 3 is a diagram showing the relationship between electric discharge power and light-emitting luminance, using $H_2S$ concentration as a parameter.

FIG. 1 is a cross-sectional view of the sputtering apparatus relating to an embodiment of the present invention. In reactive chamber 1, negative electrode 3, to which target 2 is made to adhere, is positioned opposite from positive electrode 4, in which substrate 11 is installed. Transparent electrode 12 and the first insulating layer 13 are laminated on substrate 11. Negative electrode 3 is connected to a 13.56 MHz RF power supply 6 via matching circuit 5. Positive electrode 4 is grounded. Target 2 has a 100 mm zinc manganese alloy disc including 0.5 wt % manganese. The sputtering gas is argon gas (Ar) containing $H_2S$ at a volume ratio of 40%. Mixed gas is supplied to reactive chamber 1 from gas inlet port 7 at a flow rate of 40 sccm. Light emitting layer 14 with a thickness of 0.7 um was prepared under a gas pressure of 10 mTorr, a substrate temperature of 350° C., and an electric discharge power density of 3.8 W/cm². Under these conditions, a film forming rate as high as 70 nm/min could be obtained. A similar formation rate was obtained when a gas pressure ranging from 5–20 mTorr was used and a gas flow rate ranging from 10–60 sccm was used. The film thickness of the light-emitting layer 14 is adjusted in a range of 0.6–1.0 um. As line B in FIG. 3 shows, an electric discharge density of 3.8 W/cm² corresponds to electric discharge power at a peak value of 300 W.

Similar to the first insulating layer 13, on light-emitting layer the second insulating layer 15 is prepared. The second insulating layer 15 is made to adhere firmly to the light-emitting layer 14 via the $SiO_2$. Finally, back electrode 16 is prepared. Back electrode 16 consists of Al film and Ni film at a thickness ratio of 1:1. Insulating layer 15 is made to adhere firmly to the Ni film via the Al film of back electrode 16. Ni provides good solderability. The thin-film EL element thus obtained produces a light-emitting luminance as high as 250 cd/m².

In this embodiment, although a Zn—Mn alloy target was used, a mosaic-type target can also be used. A mosaic target consists of a Zn target and a manganese plate which is made to adhere to the Zn target; the area ratio of the Zn target to the manganese plate corresponds to their composition ratio.

Figure 4:
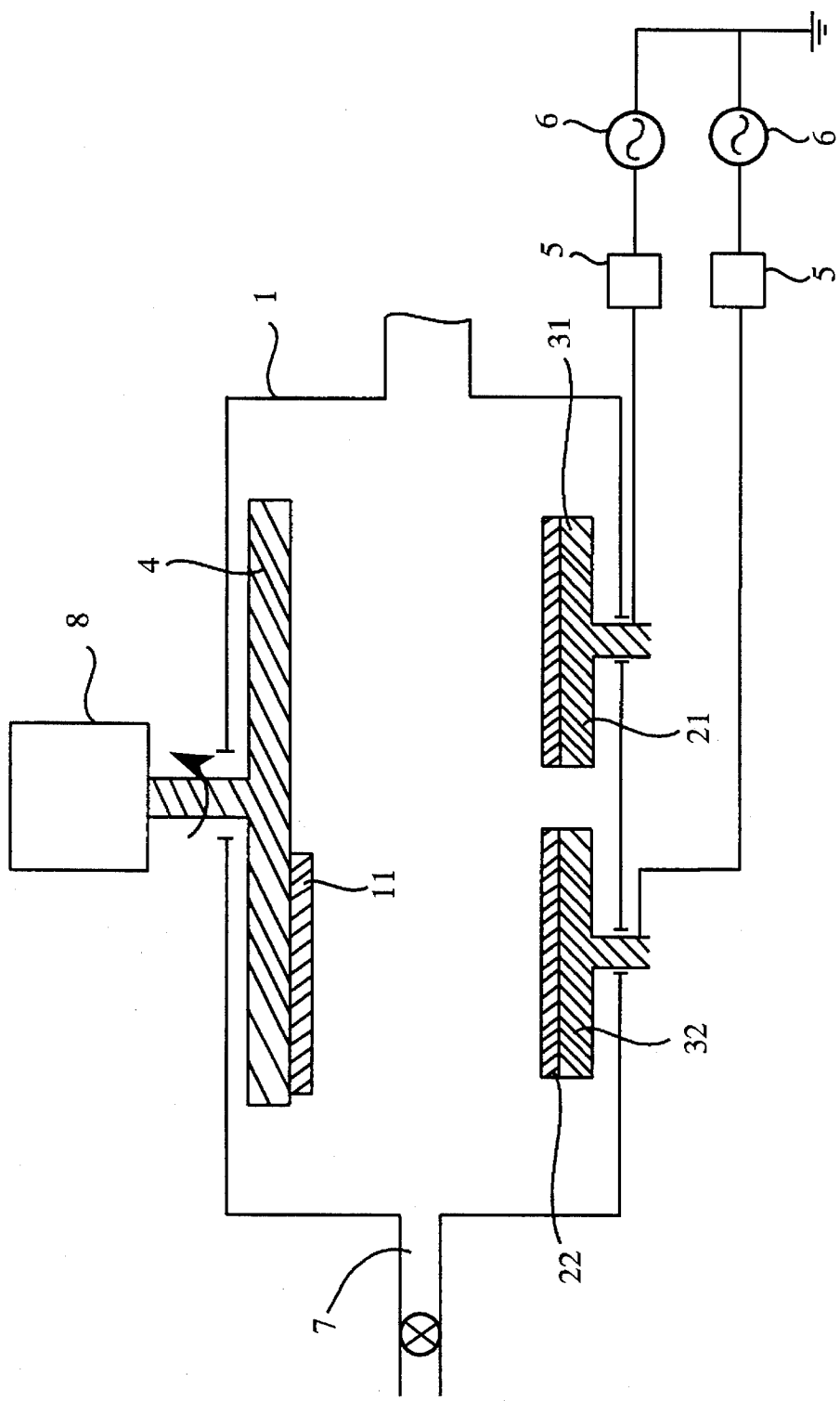
FIG. 4 is a cross-sectional view showing a sputtering apparatus relating to another embodiment of the present invention.

FIG. 4 is a layout view showing the sputtering apparatus relating to another embodiment of the present invention. This sputtering apparatus is driven using a co-sputtering method. Components in FIG. 4 common to those in FIG. 1 are represented with the same reference numbers. Positive electrode 4 is connected to rotary mechanism 8. The negative electrode consists of two negative electrodes 31 and 32, each of which is connected to an RF power supply 6 via matching circuit 5. Zn target 21 is laid on negative electrode 31, and Mn target 22 on negative electrode 32. Light-emitting layer 4 containing manganese of 0.5 wt % was formed at a gas pressure of 10 mTorr and substrate temperature of 350° C. Positive electrode 4 rotates at 50 rpm. An electric discharge power of 3.8 W/cm² is applied to the Zn target on the negative electrode 21, and 0.5 W/cm² electric discharge power is applied to the Mn target on the negative electrode 22. The film was formed at a rate of about 70 nm/min. The resulting thin-film EL element showed a high light-emitting luminance, similar to the aforementioned embodiment. When a light-emitting layer is prepared using the co-sputtering method, the ratio of electric discharge power applied to targets 21 to electric discharge power applied to target 22 is adjusted so that the Mn concentration in the light-emitting layer is maintained and controlled at the optimal value.

Next, a thin-film EL element was produced in which a transparent electrode ITO with a thickness of 1700 Å, first insulating layer of silicon dioxide and silicon nitride with a thickness of 2100 Å, a light-emitting layer with a thickness of 7000 Å, a second insulating layer of silicon dioxide and silicon nitride with a thickness of 2100 Å, and a back electrode of aluminum with a thickness of 7000 Å are sequentially formed.

A Zn—Mn alloy target was used to form the light-emitting layer. The concentration of the manganese used was 0.3 wt %. The sputtering gas used was argon gas to which hydrogen sulfide gas had been added at a prescribed concentration. The sputtering was executed at a gas pressure of 10 mTorr and a substrate temperature of 400° C. Table 1 shows the film-forming conditions and rate.

TABLE 1

| 1 $H_2S$ | 2 (W) | 3 (nm/min) |
|---|---|---|
| 25 | 200 | 42 |
| 30 | 250 | 55 |
| 40 | 300 | 70 |
| 50 | 400 | 95 |

TABLE 1
1: $H_2S$ concentration
2: Electric discharge power (W)
3: Film forming speed (nm/min)

The surface of the Zn—Mn alloy target is sulfurized under the aforementioned condition. The light-emitting layer is heated at 500° C. after the film is formed. The light-emitting luminance of the obtained thin-film EL element is high. Table 1 indicates that the light-emitting layer is formed three to seven times faster using the method of the present invention than by the conventional method.

In accordance with the present invention, a thin-film EL element is prepared by using sputtering gas containing hydrogen sulfide with a concentration by volume of greater than 20%, and by applying appropriate electric discharge power to the hydrogen sulfide concentration contained in the sputtering gas to sputter a Mn—Zn alloy target, a mosaic target, or manganese and zinc targets individually. As a result, a high-quality light-emitting layer is prepared at a sufficiently practical film-formation speed three to seven times that obtained using the prior art.

The invention has been described with reference to certain preferred embodiments thereof. It will be understood, however, that modifications and variations are possible within the scope of the appended claims.

What is claimed is:

1. A method for preparing a thin-film EL element comprising:

placing a substrate within a reactive chamber;

supplying a sputtering gas mixture at a pressure of about 5 to 20 mTorr to the reactive chamber, said sputtering gas mixture including about 25 to 50 percent by volume hydrogen sulfide and an inactive gas;

heating the substrate to a temperature of about 350°–500° C. and applying RF power to a sputtering target at a power density of about 2 to 5 W/cm², said target being located in the reactive chamber to form a light emitting layer comprising zinc sulfide and a doping material on the substrate.

2. The method of claim 1, wherein the sputtering target is an alloy of zinc and the doping material.

3. The method of claim 2, wherein the doping material comprises manganese.

4. The method of claim 1, wherein the target is a zinc substrate to which a plate of the doping material is made to adhere, and wherein the ratio of the exposed area of the zinc substrate to the exposed area of the plate has a prescribed ratio.

5. The method of claim 4, wherein the doping material comprises manganese.

6. The method of claim 1, wherein the target includes a first target comprised of zinc and a second target comprised of the doping material.

7. The method of claim 6, wherein the doping material comprises manganese.

8. The method of claim 1, wherein the doping material comprises manganese.

9. The method of claim 1, wherein said light emitting layer is deposited on said substrate at a rate not less than about 42 nm/min.

10. The method of claim 9, wherein said light-emitting layer is deposited on said substrate at a rate of about 42–95 nm/min.

* * * * *